United States Patent [19]

Hawthorne et al.

[11] Patent Number: 5,770,263

[45] Date of Patent: Jun. 23, 1998

[54] METHOD FOR IN SITU REMOVAL OF PARTICULATE RESIDUES RESULTING FROM HYDROFLUORIC ACID CLEANING TREATMENTS

[75] Inventors: Richard C. Hawthorne, Nampa; Whonchee Lee, Boise, both of Id.

[73] Assignee: Micron Technology, Inc., Boise, Id.

[21] Appl. No.: 555,488

[22] Filed: Nov. 8, 1995

[51] Int. Cl.⁶ .................................................. B05D 3/00
[52] U.S. Cl. ............................ 427/309; 134/1.3; 134/2; 134/19
[58] Field of Search ................... 139/2, 1.3, 22.1, 139/19; 156/696.1; 427/309

[56] References Cited

U.S. PATENT DOCUMENTS

| | | | |
|---|---|---|---|
| 4,605,479 | 8/1986 | Faith, Jr. | 438/660 |
| 4,749,440 | 6/1988 | Blackwood et al. | 438/706 |
| 5,235,995 | 8/1993 | Bergman et al. | 134/105 |
| 5,268,069 | 12/1993 | Chapple-Sokol et al. | 216/73 |
| 5,288,333 | 2/1994 | Tanaka et al. | 134/31 |

OTHER PUBLICATIONS

Sherman, Chemical Vapor Deposition for Microeletronics, Noyes publications, 1987, pp. 103–114.

*Primary Examiner*—Jill Warden
*Assistant Examiner*—Alexander Markoff
*Attorney, Agent, or Firm*—Workman Nydegger & Seeley

[57] ABSTRACT

Disclosed is a process for cleaning silicon surfaces of native oxide films. The process utilizes fluorine containing cleaning materials such as anhydrous hydrofluoric acid to clean the oxide from the surface. A fluorine containing particulate matter which forms on the surface as a result of the fluorine containing cleaning materials is then removed by heating the surface to a high temperature. The process is conducted in a non-oxidizing ambient and is preferably conducted in a cluster tool so that the heating step can take place in the same chamber of the cluster tool as later metal deposition step.

27 Claims, No Drawings

METHOD FOR IN SITU REMOVAL OF PARTICULATE RESIDUES RESULTING FROM HYDROFLUORIC ACID CLEANING TREATMENTS

BACKGROUND OF THE INVENTION

1. The Field of the Invention

The present invention relates to processes for the removal of native oxide from polysilicon and other silicon containing layers in the construction of integrated circuits. More particularly, the present invention is directed to a process of integrated circuit construction in which native oxide is first removed through a fluorine containing cleaning procedure followed by the further removal of residues resulting from the fluorine containing cleaning procedure.

2. The Relevant Technology

In the manufacture of integrated circuits, structures often need to be formed whereby a previously deposited silicon surface is covered with a later deposited conducting layer. One difficulty in producing these structures arises from native oxides which grow on the silicon surface previous to the deposition of the conducting layer. Native oxides, such as silicon dioxide, are formed from the reaction of silicon and oxygen, and occur whenever silicon is exposed to an oxygen containing ambient. Native oxides are typically insulative and highly resistive. Thus, when a secondary layer to be formed above the silicon is intended to form a conductive interface with the silicon, the native oxide can inhibit a fully conductive interface.

This problem is typically encountered when depositing a metal over an underlying silicon layer. One example is the formation of tungsten silicide, which is useful when forming MOS technology gate structures. When so doing, typically a layer of tungsten is deposited by chemical vapor deposition over a layer of polysilicon and annealed to form tungsten silicide. As discussed, the difficulty in this process occurs from the growth of native oxide atop the polysilicon after the polysilicon has been deposited. The native layer must be removed in order to properly form the tungsten silicide structure and to adhere it strongly to the polysilicon underlayer. Failure to do so will result in the native oxide layer acting as a resistive barrier between the polysilicon and the tungsten and prohibiting a proper anneal.

One method previously used for removing native oxide films from polysilicon and silicon substrates comprises the use of hydrofluoric acid. Typically, the silicon layer, in this case polysilicon, is exposed to the hydrofluoric acid vapor clean in a first chamber and is then transferred thereafter to the deposition chamber for deposition of tungsten. This transfer preferably occurs in a vacuum in order to avoid further native oxide growth. An undesirable side effect of this problem is the formation of a visual haze on the silicon or polysilicon. The hydrofluoric acid clean typically results in a residue of fluorine ions which form nucleation points for the formation of silicon tetrafluoride ($SiF_4$) particulate matter. This $SiF_4$ particulate matter forms the haze.

If the wafer on which the silicon substrate is formed is transferred directly to the deposition chamber with no further cleaning processes, the $SiF_4$ or $SiF_6$ particulate matter causes defects that impair the adhesion of the tungsten silicide film to the polysilicon. The consequence is that the tungsten film will form a poor interface and may even totally lift off of the substrate. Furthermore, a proper anneal can also be obstructed, resulting in the tungsten silicide not being formed and a consequent high resistivity of the structure. A similar effect would occur with the interface of any metal to a silicon substrate.

A remedy to this problematic effect in the art has been to water clean the wafer in a water bath after the hydrofluoric clean. A typical example is a vapor etch process performed in an Excalibur etching machine, manufactured by FS1 located in Chaska, Minn., U.S.A. Water clean processes must necessarily be undertaken in a bath chamber, after which the wafers are removed and transferred to a tungsten deposition chamber. This removal and transfer of the wafers is undesirable as it results in further exposure to the ambient (i.e. air) and consequently to further native oxide growth. Also, such processes do not always fully rid the surface of the $SiF_4$ particulate matter. Thus, the prior art processes are not fully satisfactory.

As a result of the problems discussed above, it is evident that a need exists in the art for a process of cleaning native oxide layers from silicon substrates in preparation for the subsequent deposition of a conducting layer. Such a process preferably could utilize fluorine cleaning processes without leaving behind $SiF_4$ particulate matter. Finally, such a process should also be able to be performed in a non-oxidizing ambient, such as performing the process within a cluster tool.

SUMMARY AND OBJECTS OF THE INVENTION

The present invention seeks to resolve the above and other problems which have been experienced in the art. More particularly, the present invention constitutes an advancement in the art by providing a process for cleaning native oxides with fluorine cleaning treatments and for removing particulate matter deposited by the fluorine cleaning treatments, and which achieves each of the objects listed below.

It is an object of the present invention to provide a process for removing native oxide from silicon containing surfaces while preventing subsequent exposure of such surfaces to the ambient so as to substantially limit native oxide regrowth on the silicon containing surfaces.

It is also an object of the present invention to provide such a process which can utilize fluorine containing treatments, such as a hydrofluoric acid vapor cleaning treatment, and do so without leaving particulate residues which inhibit proper conductive interfaces with later metallic layers.

It is another object of the present invention to provide such a process which can be performed in situ in a deposition chamber, and where the deposition chamber can be clustered with other chambers in a vacuum ambient.

In order that the above and other objects can be attained, the present invention comprises a process for the removal of native oxide from silicon surfaces with a fluorine-containing cleaning treatment, and a subsequent removal of particulate matter existing on the silicon surface as a result of the fluorine cleaning step. Under the present invention, the particulate matter is removed by heating the surface to a high temperature, thereby volatilizing the particulate matter and removing it from the surface Accordingly, the first step of the process of the present invention comprises exposing the silicon surface to a fluorine-containing cleaning material. Preferably, the fluorine-cleaning material comprises hydrofluoric acid. Even more preferably, the cleaning material comprises an anhydrous hydrofluoric acid vapor clean. The hydrofluoric acid cleaning treatment is preferably performed in a cleaning chamber of a cluster tool. The cleaning process is preferably performed in a vacuum.

After the termination of the hydrofluoric acid clean, the silicon substrate is transferred in the vacuum environment within the cluster tool or other process environment to a metal deposition chamber wherein further processes are to take place. These further processes typically comprise a later deposited metallic layer over the silicon substrate. Within the deposition chamber, the silicon surface is first heated to a temperature in excess of about 100° C. Even more preferably, the surface is heated to a temperature of within the range of 100°–600° C. Most preferably, the surface is heated to a temperature of about 300° C. This is also conducted within a non-oxidizing ambient, and preferably a vacuum.

The heating step fully volatilizes particulate matter which has formed as a result of the vapor clean. The particulate matter typically comprises $SiF_4$. This enables the silicon surface to form a proper adhering and conductive interface with later-deposited layers. In one example, the silicon substrate is a polysilicon MOS gate structure, and the later deposited metallic material comprises tungsten. Typically, the tungsten deposition step is followed by a high temperature anneal to form tungsten silicide which will, as a result of the process of the present invention, adhere properly to the polysilicon surface and which will form an optimal interface with strong adhesion and high conductivity. Similar results should also occur when using the process of the present invention to adhere other later deposited conducting materials over a previously deposited silicon containing layer.

These and other objects and features of the present invention will become more fully apparent from the following description and appended claims, or may be learned by the practice of the invention as set forth hereinafter.

DETAILED DESCRIPTION OF THE PREFERRED EMBODIMENTS

The present invention comprises a process whereby hydrofluoric acid and other fluorine-containing compounds can be used to remove native oxide films from silicon surfaces without an intervening aggregation of defect causing particulate matter on the surface. This is accomplished through the discovery by the inventor that the particulate matter that causes the defects can be volatilized at high temperatures.

Thus, the present invention comprises, in addition to the hydrofluoric acid or other fluorine containing compound cleaning steps, the further step immediately thereafter of heating the surface to a temperature in excess of 100° C. This is also preferably done in an atmosphere where there is no exposure to ambient, such that the native oxide cannot be regrown after the heat treatment. The heat treatment is even more preferable within the range of 300°–600°. Most preferably, the heat treatment is conducted at a temperature of about 300°.

The foregoing process is preferably performed inside a deposition chamber wherein a metallic layer, such as tungsten, is to be deposited. The deposition chamber is also preferably evacuated to a vacuum environment prior to the transfer of the silicon substrate into the chamber. Most preferably, the deposition chamber will be a cluster tool in which the wafer upon which the process is being performed can be transferred between processes without exposure to ambient. A cluster tool is generally defined as a transfer module which transfer wafers into a first chamber, such as a HF vapor clean, and can then transfer the wafers out of the first chamber in a controlled environment into a second chamber, such as a heat treatment chamber, deposition, deoxidation chamber, or the like. Preferably, processing will be conducted in a vacuum or purged environment, whereby the wafers are not exposed to air in the ambient.

During the forgoing processing, fluorine-containing particulate, such as silicon tetrafluorine, are volatilized by the high temperature and removed from the surface by the vacuum. Other examples of such fluorine-containing particulate are $(NH_4)_2\ SiF_6$. The volatilization of fluorine-containing particulate results in a clean surface for the later deposition of a metallic layer or other desired layers to which such layers will adhere properly so as to provide a highly conductive interface.

As an example of the inventive process, in forming MOS gate structures on silicon substrates, a polysilicon layer is typically first formed. Afterwards, a tungsten layer is deposited. In the interim between the processes, an intervening silicon dioxide layer forms above the polysilicon and must be removed. The removal of the silicon dioxide layer is performed with a hydrofluoric acid treatment. The cleaning process is preferably done in a cleaning chamber using anhydrous hydrofluoric acid vapor cleaning at a temperature in the range of about 25° C., at a pressure in the range of about 15 torr, and for a duration of exposure of about 36 seconds. Thereby, the silicon dioxide film is removed.

In a cluster tool process flow application, the wafer is transferred within the cluster tool in an ambient vacuum environment to the tungsten deposition chamber. Within the tungsten deposition chamber, the wafer is heated to a high level preferably about 300°, and then allowed to cool. Afterwards, the tungsten layer is deposited, preferably using chemical vapor deposition, on the polysilicon layer. An anneal process typically takes place next, and the tungsten and polysilicon combine to form tungsten silicide, after which further etching and other procedures are performed in completing the integrated circuit.

Through the removal of all fluorine-containing particulate matter by the heat treatment, an interface is created between the polysilicon and the tungsten silicide which has good adhesion, results in a minimum of separation between the layers, and is conducive to a proper anneal and full formation of the tungsten silicide with a resulting high conductivity.

Accordingly, a novel process has been described in which native oxide can be removed in situ without the formation of subsequent oxide films and with a clean interface whereby subsequent layers will adhere sufficiently to form a proper conductive interface.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A process for depositing a metal on an exposed silicon containing surface, the process comprising:
    subjecting the exposed silicon containing surface to a fluorine containing cleaning material, whereby a residue of fluorine ions forms nucleation points for the formation of particulate matter haze;
    heating the exposed silicon containing surface to a temperature greater than about 100° C. in a chamber having a non-oxidizing ambient so as to render the exposed silicon containing surface substantially free from native oxide and said particulate matter haze; and depositing a metal on the exposed silicon containing surface that is substantially free from native oxide in the chamber having a non-oxidizing ambient.

2. A process as recited in claim 1, wherein the fluorine containing cleaning material comprises HF.

3. A process as recited in claim 2, wherein the step of subjecting the exposed silicon containing surface to a fluorine containing cleaning material is an anhydrous gas treatment process.

4. A process as recited in claim 1, wherein the exposed silicon containing surface comprises polysilicon.

5. A process as recited in claim 1, wherein the metal deposited on the exposed silicon surface comprises tungsten.

6. A process as recited in claim 5, further comprising an annealing step wherein the tungsten is annealed with the exposed silicon containing surface to form a layer of tungsten silicide.

7. A process as recited in claim 1, wherein the particulate matter haze is silicon tetrafluorine.

8. A process as recited in claim 1, wherein the particulate matter haze is volatilized by the step of heating the exposed silicon containing surface and is removed from the exposed silicon containing surface by vacuum.

9. A process as recited in claim 1, wherein the exposed silicon containing surface is heated to a temperature in the range of between about 100° to about 600° C.

10. A process as recited in claim 1, wherein the exposed silicon containing surface is heated to a temperature of greater than 300° C.

11. A process as recited in claim 1, wherein the exposed silicon containing surface comprises polysilicon, and wherein the polysilicon is a polysilicon MOS gate structure on an integrated circuit.

12. A process as recited in claim 1, wherein the exposed silicon containing surface is heated in situ in a tungsten deposition chamber.

13. A process as recited in claim 1, wherein the exposed silicon containing silicon surface is heated in situ in a cluster tool.

14. A process as recited in claim 13, wherein the cluster tool creates a vacuum around the exposed silicon containing surface.

15. A process for forming a polysilicon gate structure on a silicon substrate, the process comprising:

subjecting a surface of a layer of polysilicon to an HF cleaning treatment, whereby a residue of fluorine ions forms nucleation points for the formation of a particulate matter haze;

immediately thereafter heating the surface of the layer of polysilicon to a temperature greater than about 100° C. in a chamber having a non-oxidizing ambient; and subsequently depositing a metal on the exposed silicon containing surface in the chamber having a non-oxidizing ambient.

16. A process as recited in claim 15, wherein the step of subjecting the surface of the layer of polysilicon to an HF cleaning treatment comprises an anhydrous HF gas treatment process.

17. A process as recited in claim 15, wherein the metal deposited on the surface of the layer of polysilicon in the depositing step comprises tungsten.

18. A process as recited in claim 17, wherein the tungsten is annealed with the surface of the layer of polysilicon to form a layer of tungsten silicide.

19. A process as recited in claim 15, wherein the particulate matter haze is silicon tetrafluorine.

20. A process as recited in claim 15, wherein the particulate matter haze is volatilized by the step of heating the surface of the layer of polysilicon and is removed from the surface of the layer of polysilicon by vacuum.

21. A process as recited in claim 18, wherein the surface of the layer of polysilicon is heated to a temperature in the range of between about 100° to about 600° C.

22. A process as recited in claim 18, wherein the surface of the layer of polysilicon is heated to a temperature greater than 300° C.

23. A process as recited in claim 18, wherein the surface of the layer of polysilicon is heated in situ in a tungsten deposition chamber.

24. A process as recited in claim 18, wherein the surface of the layer of polysilicon is heated in situ in a cluster tool.

25. A process as recited in claim 24, wherein the cluster tool forms a vacuum around the surface of the layer of polysilicon.

26. A process for depositing a metal on an exposed silicon containing surface, the process comprising:

subjecting the exposed silicon containing surface to an anhydrous HF gas treatment process in a first chamber of a cluster tool so as to form fluorine-containing particulate on the exposed silicon containing surface;

transferring the silicon substrate to a second chamber in a vacuum ambient within the cluster tool;

heating the exposed silicon containing surface in situ within the second chamber of the cluster tool to a temperature greater than 300° C. to volatilize and remove said fluorine-containing particulate formed on the exposed silicon containing surface and so as to render the exposed silicon containing surface substantially free from native oxide; and depositing tungsten on the exposed silicon containing surface that is substantially free from native oxide in the second chamber of the cluster tool.

27. A process as recited in claim 26, wherein the exposed silicon containing surface comprises polysilicon.

* * * * *

UNITED STATES PATENT AND TRADEMARK OFFICE
CERTIFICATE OF CORRECTION

PATENT NO. : 5,770,263
DATED : Jun. 23, 1998
INVENTOR(S) : Richard C. Hawthorne; Whonchee Lee It is certified that error appears in the above-identified patent and that said Letters Patent is hereby corrected as shown below:

Col. 3, line 63, after "which" change "transfer" to --transfers--

Col. 4, line 3, after "the" change "forgoing" to --foregoing--

Signed and Sealed this

Twentieth Day of July, 1999

Attest:

Q. TODD DICKINSON

*Attesting Officer*    Acting Commissioner of Patents and Trademarks